United States Patent
Kanase

[19]

[11] Patent Number: 6,001,282
[45] Date of Patent: Dec. 14, 1999

[54] ELECTROMAGNETIC SHIELD

[75] Inventor: Rick K. Kanase, Salem, Oreg.

[73] Assignee: Electro K, Inc., Los Angeles, Calif.

[21] Appl. No.: 09/312,085

[22] Filed: May 15, 1999

Related U.S. Application Data

[60] Provisional application No. 60/093,966, Jul. 24, 1998.

[51] Int. Cl.[6] .................................................. H05F 3/00
[52] U.S. Cl. ........................ 252/500; 428/372; 428/368; 442/417; 361/222
[58] Field of Search ............................ 252/500; 428/372, 428/368, 402; 442/417; 361/222

[56] References Cited

U.S. PATENT DOCUMENTS 5,928,784  7/1999  Sugihara et al. .......................... 428/372

FOREIGN PATENT DOCUMENTS

| 11019232A | 1/1999 | Japan | A61N 5/06 |
|---|---|---|---|
| 11038370 | 2/1999 | Japan | A61F 9/00 |

*Primary Examiner*—Mark Kopec
*Assistant Examiner*—Derrick Hamlin
*Attorney, Agent, or Firm*—Ted Masters

[57] ABSTRACT

An electromagnetic shield (20) for protecting individuals from the adverse effects of electromagnetic radiation includes a homogenous composition of finely ground tourmaline and a porous carrier. The electromagnetic shield (20) is attached to a radiating device such as the handset of a portable telephone. The tourmaline reacts with moisture in the air to produce negative ions which cancel the positive ions created by the radiating device, thereby substantially reducing or eliminating the harmful effects of the radiation. The electromagnetic shield (20) composition can be molded into housings for radiating devices.

12 Claims, 2 Drawing Sheets

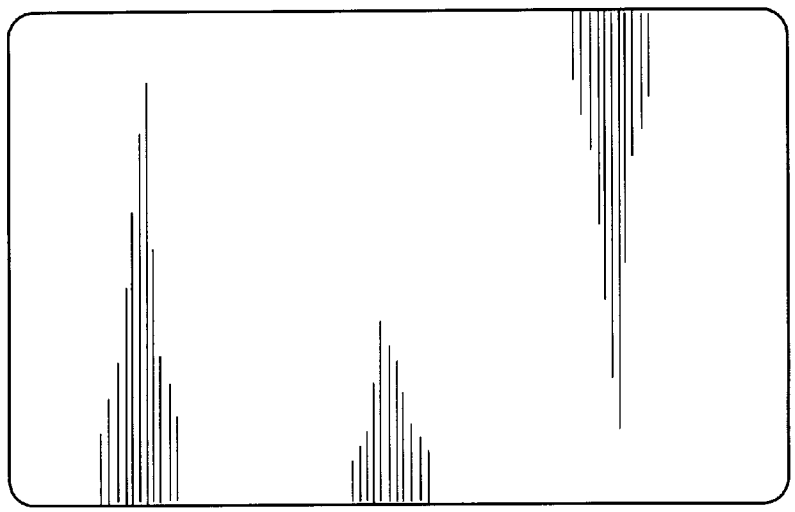
Fig_6
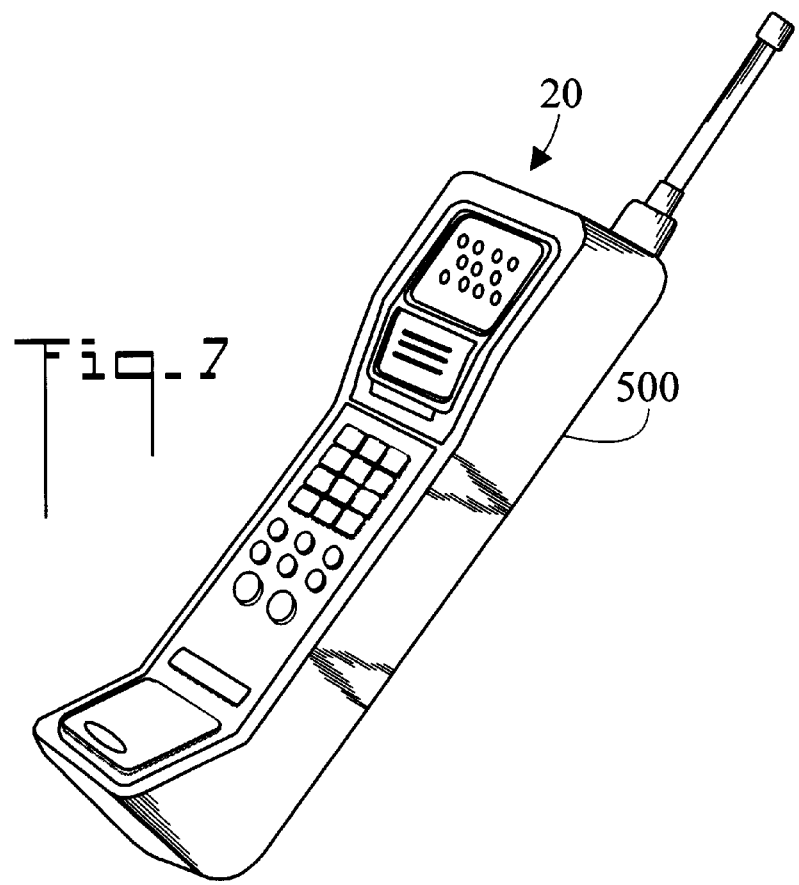
Fig_7

ELECTROMAGNETIC SHIELD

CROSS REFERENCE TO RELATED APPLICATION

This application claims the filing benefit under 35 U.S.C. §119(3e) of U.S. Provisional Application No. 60/093,966, filed Aug. 24, 1998, which is included herein by reference.

TECHNICAL FIELD

The present invention pertains to devices which provide protection from electromagnetic radiation, and in particular to a device which produces negative ions which cancel the positive ions emanating from a radiation source.

BACKGROUND ART

It is well known in the scientific community that exposure to electromagnetic radiation can have debilitating effects on humans. The effects are most pronounced when the exposure is protracted and at high radiation levels, however lesser degrees of exposure can also cause illness and even death. It is therefore desirable to protect people from the adverse effects of electromagnetic radiation by in some way shielding or blocking the radiation before it reaches a person. The most simple and direct method of protection is to simply install a physical shield between the electromagnetic radiation source and the person. The shield is usually made of metal which absorbs and blocks the electromagnetic radiation and thereby protects the person. Examples of this technology include the lead pads used during X-ray diagnosis, and the mesh screen in the door of a microwave oven.

Another protection technique is to employ the principles of physics to cancel and therefore neutralize the electromagnetic radiation. Electromagnetic radiation waves strike the human body with a stream of positive ions. These positive ions create a magnetic field which magnetizes the cells in the body thereby causing the unwanted health effects. If the positive ions can be stopped before they reach the body by canceling them with negative ions, then the damaging effects of the positive ions can prevented. It is toward this ion cancellation principle that the present invention is directed.

DISCLOSURE OF INVENTION

The present invention is directed to an electromagnetic shield which protects a person from the harmful effects of electromagnetic radiation. The present invention can be applied to a wide variety of radiation-producing devices such as cellular telephones, portable telephone handsets, microwave ovens, computers, computer monitors, television sets, radios, car instrumentation, air conditioners, electric heaters, electric ranges, refrigerators, washing machines, electrical dryers, or any other electronic device which produces electromagnetic radiation. In laymen terms, the operation of the present invention is very simple. The invention continuously creates negative ions which cancel out the positive ions of the electromagnetic radiation thereby preventing the damaging effects of the radiation.

In accordance with a preferred embodiment of the invention, an electromagnetic shield comprises a composition of granular tourmaline and a porous carrier wherein the tourmaline is distributed throughout the porous carrier.

In accordance with an important aspect of the invention, the tourmaline is substantially homogeneously distributed throughout the carrier.

In accordance with an important feature of the invention, the carrier comprises a polymer, such as high density polyethylene.

In accordance with another important aspect of the invention, the composition is about 10–15% tourmaline by weight.

In accordance with another important feature of the invention, the tourmaline has a particle size of about 2–4 microns, with 3 microns being preferred.

In accordance with an important aspect of the invention, the composition is molded into a substantially planar shape suitable for attachment to a radiation-producing device.

In accordance with an important aspect of the invention, the composition is molded to form a housing which surrounds a positive ion-generating device such as a cell phone, TV set, microwave oven, etc.

Other features and advantages of he present invention will become apparent from the following detailed description, taken in conjunction with the accompanying drawings, which illustrate, by way of example, the principles of the invention.

BRIEF DESCRIPTION OF DRAWINGS

FIG. 6 is a top plan view of a third embodiment; and,

FIG. 7 is a reduced perspective view of the electromagnetic shield comprising the housing of a radiation-producing device.

MODES FOR CARRY OUT THE INVENTION

Figure 1:
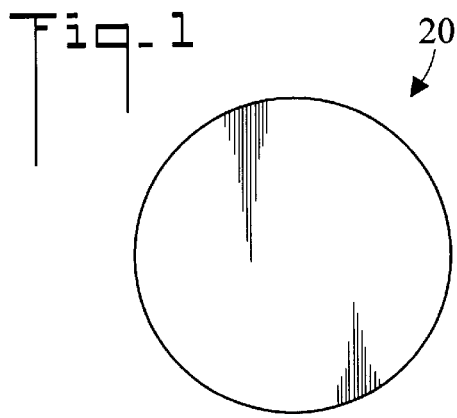
FIG. 1 is a top plan view of an electromagnetic shield in accordance with the present invention.
Figure 3:
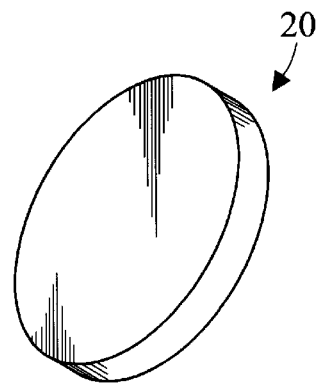
FIG. 3 is a perspective view of the electromagnetic shield.
Figure 2:
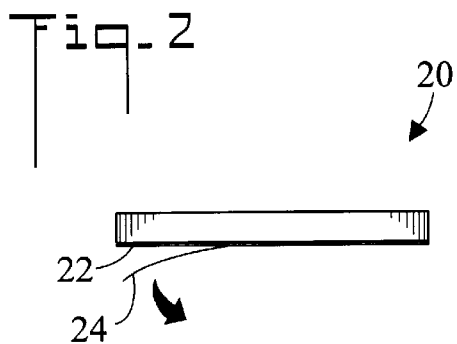
FIG. 2 is a side elevation view of the electromagnetic shield.

Referring initially to FIGS. 1–3, there are illustrated top plan, side elevation, and perspective views respectively of an electromagnetic shield in accordance with the present invention, generally designated as 20. Electromagnetic shield 20 comprises a quarter-sized disk which is made of a porous resin such as high density polyethylene in composition with an ultra fine powder (about 3 micron particle size) of the gemstone tourmaline. The polyethylene and tourmaline are blended to form a homogeneous mixture, so that the granulated tourmaline is substantially evenly distributed throughout the porous polyethylene carrier. Electromagnetic shield 20 is affixed to a device which emits electromagnetic radiation, such as a portable telephone handset. In a preferred embodiment, the electromagnetic shield 20 is placed in a location which is generally between the emitting device and the user. Attachment of the electromagnetic shield 20 can be effected by any convenient means such as with an adhesive 22 having a peel-off covering 24, double sided tape, or by a mechanical holder. It may be readily appreciated that while the shown preferred embodiment of electromagnetic shield 20 is the general size and shape of a quarter, other sizes and shapes could also be used to accommodate both the physical dimensions of the emitting device and the level of radiation emission. A substantially planar shape is preferred so as to increase the surface area of the shield that is exposed to the atmosphere.

Figure 4:
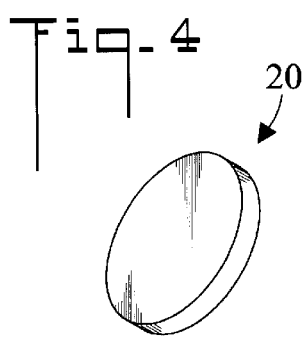
FIG. 4 is a perspective view of a second smaller embodiment.

FIG. 4 is a perspective view of a second smaller dime-sized embodiment.

Figure 5:
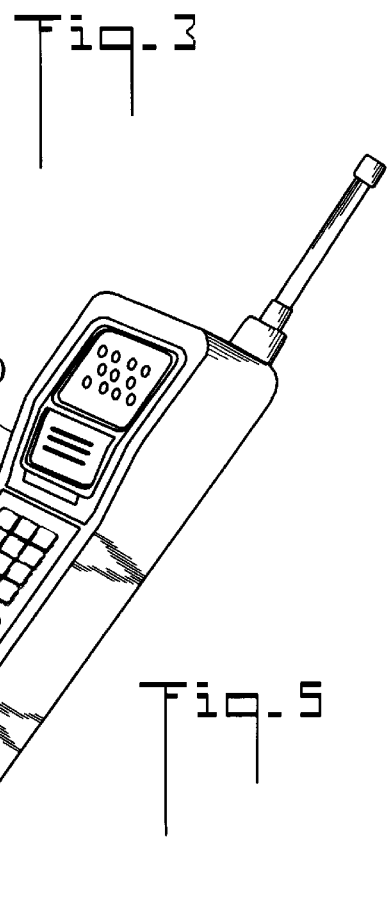
FIG. 5 is a reduced perspective view of the electromagnetic shield installed on a portable telephone handset.

FIG. 5 is a reduced perspective view of the electromagnetic shield 20 installed on a portable telephone handset 500. It may be appreciated that a plurality of electromagnetic shields 20 could be placed on devices which emit high levels of radiation, in order to neutralize the greater number of positive ions. For example, four electromagnetic shields 20 could be spaced around the case of a television set.

FIG. 6 is a top plan view of a third credit card-sized embodiment.

FIG. 7 is a reduced perspective view of the electromagnetic shield 20 comprising the housing of a radiation-producing device 500. It may be readily appreciated that the electromagnetic shield 20 composition of the present invention could be molded into housings of all shapes and sizes such as for TV sets, microwave ovens, automobile dashboards, fax machines, etc. It may also be appreciated that a pigment could be added to the composition of the present invention to produce a variety of housing colors.

The basic fundamental reaction which creates negative ions occurs because of the unique combination of the highly porous carrier (e.g. high density polyethylene) and the finely ground tourmaline. The polyethylene is very porous and when combined with the finely ground tourmaline creates a reaction that decomposes water electrically in the area surrounding the electromagnetic shield 20. The uniqueness of the tourmaline is that it naturally creates static electricity and gives off a weak current of about 0.06 milliamps (mA). The polyethylene being very porous allows the weak current to decompose the moisture (water $H_2O$) in the air surrounding the electromagnetic shield 20. The decomposed water gives off hydrate ions (OH—). Simultaneously, a coupling reaction of hydrate ions and water create hydroxyl ions ($H_3O_2$—) to form a continuous stream of negative ions. The porosity of the polyethylene allows the interaction of the tourmaline and moisture in the air to continuously create negative ions. The porosity of the carrier increases the amount of tourmaline that is exposed to water in the air, and thereby enhances the negative ion producing effect of the composition. A quarter-sized piece of high density polyethylene has the equivalent surface area of 3 square meters which allows for the production of continuous negative ions. The above described creation of negative ions will continue until the porosity of the polyethylene is contaminated with dirt or other particulate mater such as oil. Under normal use, it is estimated that contamination will take over 7 years to occur. Tourmaline also has an absorption effect in relation to electromagnetic waves with long wave length (0.15 m to 10 m) which are considered injurious to health.

The percentage of tourmaline in the composition can vary, but the best performance without causing strength issues is about 10–15% by weight.

In a preferred embodiment, a 3 micron tourmaline particle size is used. However, a particle size of anywhere from 2 to 4 microns will work satisfactorily. 3 microns results in a very fine powder and can be uniformly distributed throughout the polyethylene. This size allows for a maximum distribution throughout the porosity of the high density polyethylene. By having a small particle size, the electric reactions can occur more efficiently with the water available in the air. If the particle size is too large, the effectiveness of the reaction is diminished.

There are several varieties of tourmaline that can be used in the present invention. Schorl (iron tourmaline) is the most abundant and least expensive, while Elbaite (lithium tourmaline) is less abundant. Dravite (brown) and Uvite (gray) tourmaline can also be used, but have weaker electrical properties.

There can be substitutions for the polyethylene such as using low and medium density polyethylene, another porous plastic material, or another porous material. The reason for using a high density polyethylene is that the porosity of the high density polyethylene increases the surface area where the hydration reaction can occur and give off negative ions. Any material that is very porous and therefore offers a large surface area, and that can accommodate a substantially uniform distribution of the tourmaline, could be substituted for polyethylene. Low density polyethylene does not perform as well as high density polyethylene due to its reduced porosity.

The water vapor in the air is what the present invention uses to produce negative ions. There is enough water vapor in the air whether you are in a very dry or humid condition. The present invention performs satisfactorily in conditions as low as 20% humidity. Testing has shown that the present invention can reduce the amount of positive ions by 90%.

In terms of manufacture, the tourmaline and polyethylene are blended using 10–15% tourmaline. The blend is then transferred to a heated auger and the composition is extruded into $\frac{1}{16}$ inch pellets. The pellets are then used in a conventional injection molding process. The composition of the present invention can be colored by adding about 4% pigment. For example, to make a 100 lb. batch, 4 lbs. of pigment would be added to 81 lbs. of polyethylene and 15 lbs. of tourmaline.

The preferred embodiments of the invention described herein are exemplary and numerous modifications, dimensional variations, and rearrangements can be readily envisioned to achieve an equivalent result, all of which are intended to be embraced within the scope of the appended claims.

I claim:

1. An electromagnetic shield, comprising:

a composition of tourmaline and a polymer.

2. An electromagnetic shield according to claim 1, further including:

said composition being substantially homogeneous.

3. An electromagnetic shield according to claim 1, further including:

said composition including about 10–15% tourmaline by weight.

4. An electromagnetic shield according to claim 1, further including:

said tourmaline having a particle size of about 2–4 microns.

5. An electromagnetic shield according to claim 4, further including:

said particle size being 3 microns.

6. An electromagnetic shield according to claim 1, further including:

said polymer being high density polyethylene.

7. An electromagnet shield according to claim 1, further including:

said composition molded into a substantially planar shape.

8. A electromagnetic shield according to claim 1, further including:

said composition molded to form a housing for a positive ion-generating device.

9. A negative ion-generating shield, comprising:

tourmaline homogeneously carried by a polymer.

10. A negative ion-generating shield according to claim 9, further including:

said shield including about 10–15% tourmaline by weight.

11. A negative ion-generating shield according to claim 9, further including:

said tourmaline having a particle size of about 2–4 microns.

12. A negative ion-generating shield according to claim 9, further including:

said polymer being high density polyethylene.

\* \* \* \* \*